(12) United States Patent
Russell

(10) Patent No.: US 6,458,252 B1
(45) Date of Patent: Oct. 1, 2002

(54) HIGH TARGET UTILIZATION MAGNETIC ARRANGEMENT FOR A TRUNCATED CONICAL SPUTTERING TARGET

(75) Inventor: Derrek Andrew Russell, Scottsdale, AZ (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/688,709

(22) Filed: Oct. 17, 2000

Related U.S. Application Data

(63) Continuation-in-part of application No. 09/442,600, filed on Nov. 18, 1999, now Pat. No. 6,287,435.

(51) Int. Cl.$^7$ .............................................. C23C 14/35
(52) U.S. Cl. ........................... 204/192.12; 204/298.17; 204/298.18; 204/298.19
(58) Field of Search ....................... 204/192.12, 298.17, 204/298.18, 298.19, 298.2

(56) References Cited

U.S. PATENT DOCUMENTS

| | | | | |
|---|---|---|---|---|
| 4,461,688 A | * | 7/1984 | Morrison, Jr. | 204/298.19 |
| 4,990,229 A | | 2/1991 | Campbell et al. | 204/298.06 |
| 5,178,739 A | | 1/1993 | Barnes et al. | 204/192.12 |
| 5,262,028 A | | 11/1993 | Manley | 204/192.12 |
| 5,284,564 A | | 2/1994 | Maass | 204/298.2 |
| 5,763,851 A | | 6/1998 | Forster et al. | 219/121.43 |
| 5,800,688 A | | 9/1998 | Lantsman et al. | 204/298.11 |
| 5,855,745 A | | 1/1999 | Manley | 204/192.12 |
| 6,080,287 A | | 6/2000 | Drewery et al. | 204/192.15 |
| 6,287,435 B1 | * | 9/2001 | Drewery et al. | 204/298.09 |

FOREIGN PATENT DOCUMENTS

| | | |
|---|---|---|
| EP | 0 297 779 A | 1/1989 |
| WO | WO 99/57746 | * 11/1999 |

OTHER PUBLICATIONS

*PCT Search Report*, dated Mar. 2, 2001.

* cited by examiner

*Primary Examiner*—Rodney G. McDonald
(74) *Attorney, Agent, or Firm*—Wood, Herron & Evans, L.L.P.

(57) ABSTRACT

A magnetron sputter coating vacuum processing system has a magnetron cathode that includes a frusto-conical target having a cone-shaped magnet assembly that causes the erosion rate to be highest under a main magnetic tunnel at an intermediate radius or the centerline of the target when the target is uneroded, with the location of the highest erosion rate gradually shifting to two areas as the target erodes, one being an inner at radii less than that of the target centerline and one being an outer area at radii greater than the target centerline. As a result, the target erosion tends to be equalized over the target area during the life of the target, improving target utilization. The magnet assembly includes three magnet rings, including an inner ring and an outer ring having poles magnetically connected by a yoke, which rings form a main magnetic tunnel. The polar axis of the inner ring is parallel to the target surface, and the polar axis of the outer ring is perpendicular of the target surface. An intermediate magnet ring, with a polar axis parallel to the target surface and oriented to produce a field opposite to the orientation of the poles producing the main tunnel, opposes and flattens the main tunnel as the target erodes, while separate inner and outer minor tunnels supported by the magnets of the intermediate ring and the respective inner and outer rings emerge above the target surface as the target erodes and the sputtering surface recedes into the fields of the magnets.

20 Claims, 2 Drawing Sheets

HIGH TARGET UTILIZATION MAGNETIC ARRANGEMENT FOR A TRUNCATED CONICAL SPUTTERING TARGET

This application is a Continuation-In-Part of U.S. patent application Ser. No. 09/442,600, filed Nov. 18, 1999 now U.S. Pat. No. 6,287,435, and hereby expressly incorporated by reference herein.

FIELD OF THE INVENTION

This invention relates to the magnetron sputtering, and more particularly, to magnetron magnet design for the efficient utilization of a sputtering target.

BACKGROUND OF THE INVENTION

Magnetron sputtering, or magnetically enhanced sputtering, involves the use of a sputtering target to provide coating material for vapor phase deposition in a vacuum onto substrates in a chamber. In sputtering, the sputtering target is energized with a negative potential to act as a cathode in a glow discharge system. In magnetron sputtering, magnets generate a magnetic field in the form of a closed loop magnetic tunnel over the surface of the sputtering target. The magnetic tunnel confines electrons near the surface of the target. The electron confinement allows the formation of a plasma with significantly lower ignition and extinction voltages for a given process pressure, and significantly lower ignition and extinction pressures for a given cathode voltage.

A conventional magnetic tunnel confines near the target surface both thermal electrons and secondary electrons. Thermal electrons are distinguished from secondary electrons by their origins, which give the electrons different characteristics. Thermal electrons are created through an ionizing collision of an atom or ion with another electron. Thermal electrons are much more numerous than secondary electrons but have much lower energy. Secondary electrons are emitted from the target upon impact of the target by an ion.

The tunnel forces the secondary electrons into semicircular orbits along the length of the magnetic tunnel due to the influence of the component of the magnetic field that is parallel to the uneroded target surface in the cross-sectional plane. The component of the magnetic field perpendicular to the uneroded target surface forces secondary electrons moving parallel to the axis of the tunnel to move laterally in the cross-sectional plane toward the magnetic centerline of the tunnel, which is the line on the surface of the target where the magnetic field perpendicular to the uneroded target surface is zero. Thermal electrons, on the other hand, move back and forth in the cross-sectional plane of the tunnel and form helical orbits along the lines of magnetic flux. Because of their low mobility perpendicular to the lines of magnetic flux, thermal electrons are confined to the region of the cathode. Magnetic mirrors created by converging magnetic flux lines at the edge of the magnetic tunnel keeps the thermal electrons reflecting from side to side as the low mobility of the thermal electrons perpendicular to the magnetic flux lines keeps them moving in helical orbits around the flux lines. The mirror effect is strongest at the edges of the magnetic tunnel and vanishes above the magnetic centerline of the tunnel, so that the thermal electrons move horizontally in a one-dimensional potential well that is centered at the magnetic centerline of the tunnel.

The electron confining properties of magnetron sputtering are effective in enhancing plasma density near the target surface and make magnetically enhanced sputtering much more practical than traditional diode sputtering. However, the conventional magnetic tunnel is responsible for low target utilization because the concentration of electrons near the magnetic centerline of the tunnel causes the plasma density to be similarly concentrated, making the erosion rate highest in this region. Further, as the target erodes, the target surface in the area adjacent the centerline erodes into even stronger magnetic fields, which accelerates the concentration of the erosion. In addition, the concentrated erosion produces a V-shaped profile redirecting secondary electrons from the opposite walls to the center of the erosion groove, further concentrating the plasma there. Typically, utilization of a target of uniform thickness has been approximately 25%. Poor target utilization undermines the economics of thin film deposition by increasing the number of expended targets and amount of unused target material as well as the machine downtime required for target changes. Uneroded areas of the target tend to occur near the edges of the magnetic tunnel. Where such areas exist, they tend to accumulate redeposited material that flakes off into the processing chamber to produce particulate contamination of the substrate.

Magnetic tunnels have been employed having nonsymmetrical shapes that are rotated with respect to the target to manipulate the erosion profile. Such rotation is useful in achieving improved film uniformity on the substrate, achieving higher target utilization and eroding points on the target that would otherwise be left uneroded if the magnetic tunnel were static. These rotating arrangements are only convenient for round planar targets. For rectangular and annular targets, only static magnetic arrangements have been practical.

For frusto-conical targets and other annular or ring-shaped targets having other system components located in the center of the target, the magnetron arrangements of the prior art have not provided high target utilization. While magnetically enhanced sputtering has made sputtering a practical and economically viable technique for depositing thin films, its full economic potential has not been realized in the case of static magnetic arrangements.

Accordingly, there remains a need to provide a magnet design that will produce high target utilization with frusto-conical and other annular targets.

SUMMARY OF THE INVENTION

An objective of the present invention is to provide for improved utilization and full face erosion of a frusto-conical target in a magnetron sputtering apparatus. A particular objective of the present invention is to provide for improved utilization of an annular target without restricting availability of the volume within the opening in the center of the target to use for other hardware, such as, for example, an ICP source.

In accordance with the principles of the present invention, a sputtering apparatus that includes an frusto-conical or similar annular sputtering target is provided with a magnetron magnet assembly that causes the erosion of the target to move from the center of the target annulus to inner and outer regions as the target erodes. The magnet assembly is positioned behind the target to produce a plasma confining magnetic field over the target in the shape of an annular tunnel on the surface of the annular target surrounding the opening at the target center. The walls of the target form a truncated cone that is inclined, for example, at about 35° to the plane of the central opening.

In one embodiment of the invention, three permanent magnet rings produce three magnetic tunnels. The relative contributions of the three tunnels produces the effect of magnetic flux lines that are parallel to the surface of the target. For a thin target, and as some point part way through the lives of thicker targets, an inner magnetic tunnel and an outer magnetic interact with a main central magnetic tunnel to produce a resultant magnetic flux parallel to the surface of the uneroded target. With such thicker targets, a main central tunnel dominates early in the target's life to erode the mean radius of the annular target along the target centerline and inner and outer tunnels dominate later in the life of the target to erode areas adjacent the inner and outer rims of the target annulus and spread the erosion groove inward and outward of the target centerline in the same manner as if the flux remained parallel to the uneroded target surface throughout the life of the target.

In the preferred embodiment, a sputtering apparatus, is an ionized physical vapor deposition apparatus that includes a vacuum processing chamber, a substrate support in the processing chamber for supporting a substrate for processing, an annular magnetron sputtering cathode assembly having a central opening and an inductively coupled plasma source behind a dielectric window in the central opening. The magnetron cathode assembly includes a frusto-conical sputtering target having an interior conical sputtering surface facing the substrate support with the outer edge of the target closer to the substrate support than the inner edge. A frusto-conical magnet assembly is situated behind, and parallel to, the sputtering target. The magnet assembly is configured to produce a main magnetic tunnel having magnetic field lines spanning a major portion of the sputtering surface and straddling the centerline of the sputtering surface, an inner magnetic tunnel having magnetic field lines extending between the target inner edge and centerline, and an outer magnetic tunnel having magnetic field lines extending predominantly between the outer edge and centerline of the target. The magnetic fields of the three tunnels interact in a way that tends to produce a resulting magnetic flux that is relatively parallel to the target surface. For targets that are thicker, this resultant flux tends to arc over the target centerline early in the target's life, become flatter part way into the target's life and gradually and progressively take on the shape of two tunnels, one inside of the target centerline and one outside of the target centerline. In this way, where erosion of the target proceeds at a greater rate at the centerline at the beginning of the target's life, compensating erosion will occur toward the inner and outer edges of the target later in the target's life so that target utilization is uniform over the entire life of the target.

The relative strengths of the magnetic fields are such that plasma confined by the magnetic flux that is shaped thereby produces a greater target erosion rate at the centerline than at the inner and outer areas thereof when the target is uneroded which continuously and progressively changes to a lesser target erosion rate at the centerline than at the inner and outer areas thereof as the target erodes. This effect is greater for thicker targets. At some point in the life of the target, the magnetic flux is parallel to that which was the surface of the target before the target eroded. For very thin targets, this flux shape may exist throughout the target's life. For thin as well as thick targets, the flat shape of the magnetic flux or a progressive flattening of the magnetic flux are the result of the relative contributions of the magnetic rings that produce the three magnetic tunnels.

Preferably, the configuration and strengths of the magnetic rings are optimized for specific targets. For example, where a target is very thin, the relative contributions of the main tunnel and the inner and outer tunnels are adjusted such that the resultant magnetic flux lines are parallel to the target surface. For thicker targets, the relative contributions of the main tunnel and the inner and outer tunnels are adjusted such that the resultant magnetic flux lines form a tunnel at the target surface that is similar to that of a conventional magnetic arrangement at the beginning of target life, but as the target erodes the shape of the flux lines becomes flat so as not to pinch the plasma. As the target erodes further, the inner and outer tunnels are exposed to the plasma as the target surface recedes into these tunnels, resulting in higher plasma density near the inner and outer edges of the annular conical target.

The frusto-conical magnet assembly preferably includes an inner pole of a first polarity and an outer pole of a second polarity producing the first magnetic tunnel by a first magnetic field extending between the inner and outer poles. The magnet assembly preferably further includes an inner-central pole of the second polarity and an outer-central pole of the first polarity producing a reverse magnetic field opposing the first magnetic field on the centerline of the target such that the resulting strength of the first and reverse magnetic fields decreases on the centerline as the sputtering surface erodes into the target. Preferably, the inner pole and the inner-central pole produce the inner magnetic tunnel formed of magnetic field lines extending between the inner and inner-central poles that lie beneath the main magnetic tunnel over the annular inner area, while the outer pole and the outer-central pole produce the outer magnetic tunnel formed of magnetic field lines extending between the outer and outer-central poles beneath the main magnetic tunnel over the annular outer area.

The preferred magnet assembly is formed of permanent magnets in the form of a plurality of preferably three circular magnetic rings arranged in a cone behind, and parallel to, the conical sputtering target. The rings are preferably made up of individual square magnets arranged in a frusto-conical shape, with their polar axes extending perpendicular to the circumference of the rings. The three rings include an inner, an outer and an intermediate magnetic ring. The polar axes of the magnets of the inner and intermediate rings are oriented parallel to the cone and those of the outer ring are perpendicular to the cone. A yoke of magnetically permeable material lies behind the cone and magnetically interconnects the inner and outer magnetic rings.

The present invention improves the utilization of frusto-conical targets from previously about 25% into the range of 50–60%. Erosion of a conical target is maintained over the entire area of the sputtering surface of the target, thereby avoiding the production of particulate contamination of the sputtering chamber.

These and other objectives and advantages of the present invention will be more readily apparent from the following detailed description.

DETAILED DESCRIPTION

Figure 1:
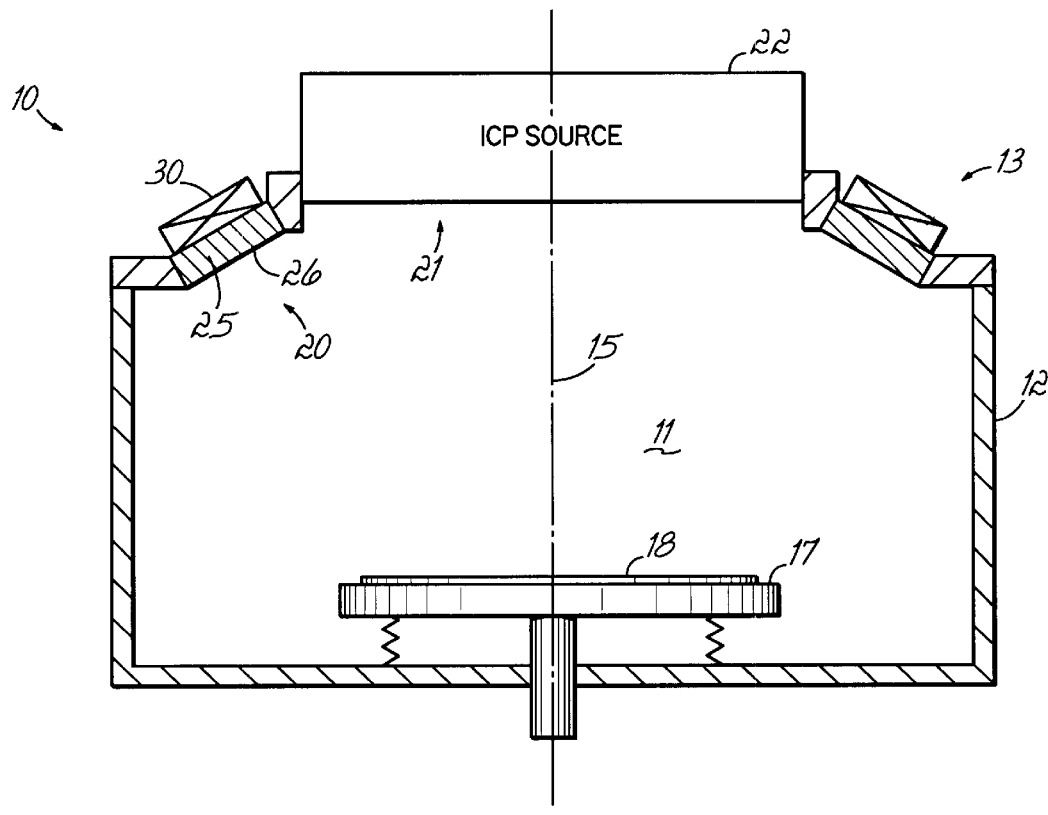
FIG. 1 is a schematic diagram of an ionized physical deposition apparatus embodying principles of the present invention.

FIG. 1 illustrates a sputter coating apparatus, specifically an ionized physical deposition (iPVD) apparatus 10, according to one embodiment of the present invention. The IPVD apparatus 10 includes a vacuum chamber 11 bounded by a chamber wall 12. The chamber 11 is provided with an ionized physical vapor deposition (IPVD) source 13 for supplying coating material in vapor form into the volume of the sputtering chamber 11 and for ionizing the sputtering material vapor. The chamber 11 has a central axis 15, extending through the center of the source 13. A wafer support 17 is also provided in the chamber 11, at the end thereof opposite the source 13 and centered on the axis 15, for holding a substrate wafer 18 centered on the axis 15 and facing the iPVD source 13 during processing. Other components of the iPVD apparatus 10 are more particularly described in U.S. patent application Ser. No. 09/442,500, referred to above. The general concepts of the source 13 are described in U.S. Pat. No. 6,080,287, hereby expressly incorporated by reference herein.

The IPVD source 13 includes a magnetron sputtering cathode assembly 20, which is annular in shape and has an opening 21 in the center thereof concentric with the axis 15. Centered in the opening 21 on the axis 15 is an RF source assembly 22, which energizes a high-density, inductively coupled plasma (ICP) in the chamber 11. The cathode assembly 20 further includes a frusto-conical, or truncated cone-shaped, sputtering target 25 having an conical sputtering surface 26 on the interior thereof facing a substrate on the support 17 and inclined toward the axis 15.

In sputter coating processes, coating material of which the target 25 is made is vaporized by bombardment with positive ions from a main sputtering plasma formed in a process gas, such as argon, in the chamber 11, maintained at a subatmospheric or vacuum pressure, typically less than 100 mtorr. In iPVD systems, atoms or minute particles of the material that are dislodged from the target 25 by the ion bombardment are ionized by a secondary plasma or ICP.

Figure 2:
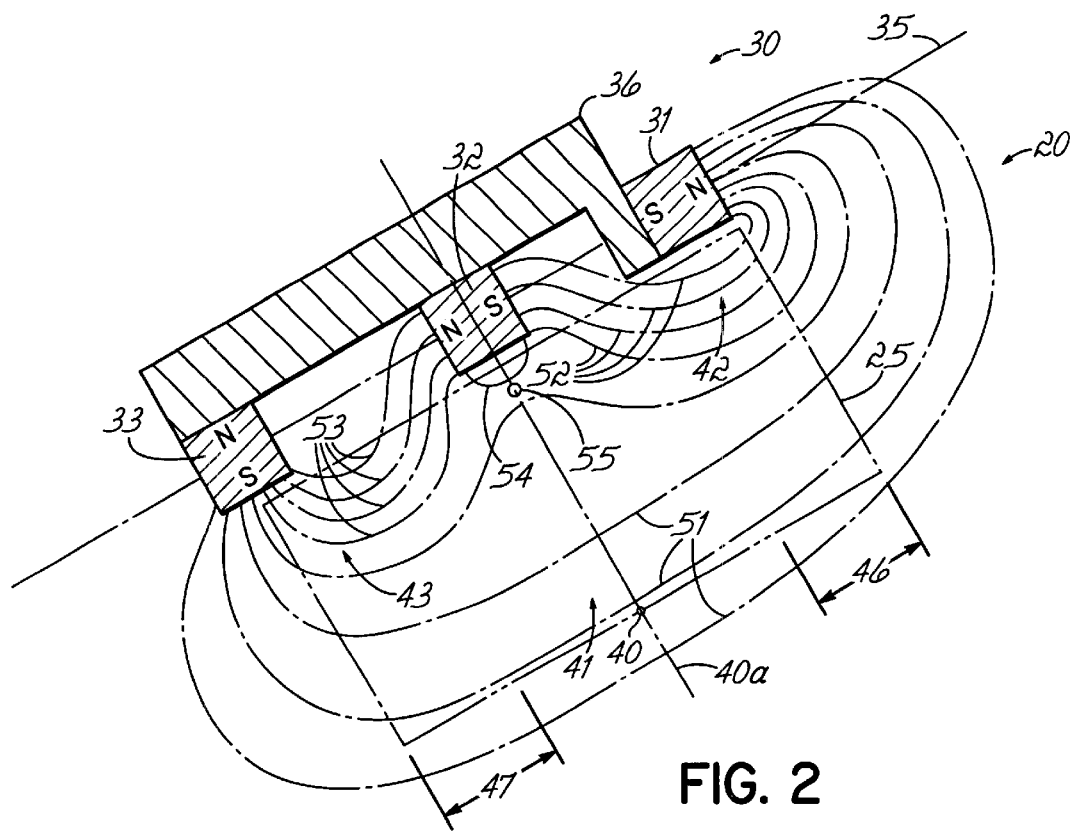
FIG. 2 is an enlarged cross-sectional diagram through the cathode assembly of FIG. 1.
Figure 3:
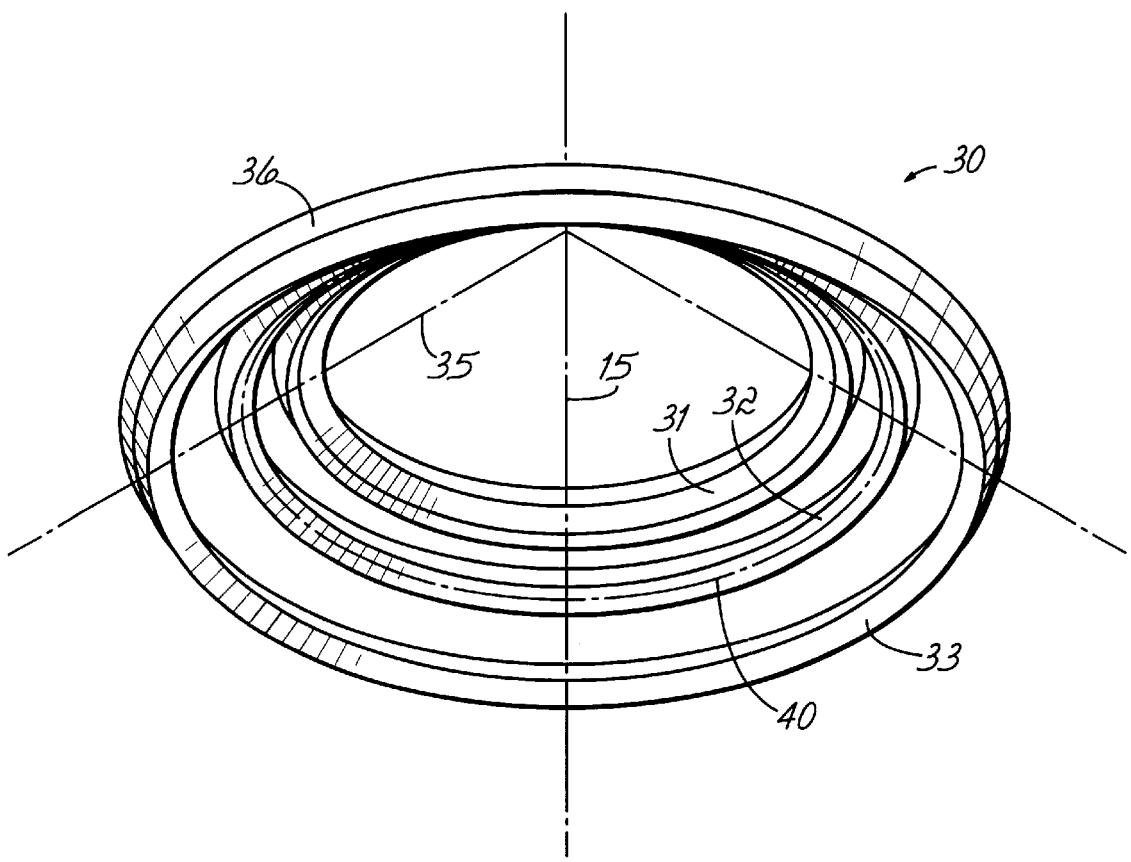
FIG. 3 is a perspective view of the magnetron magnet assembly of FIGS. 1 and 2.

The cathode assembly 20 includes a magnetron magnet assembly 30, illustrated in more detail in FIGS. 2 and 3, that contains a plurality of preferably three magnet rings 31–33 arranged in a cone 35 that lies parallel to the target 20 on the exterior or back thereof. The magnet assembly 30 generates a magnetic tunnel that traps electrons close to the surface 26 of the target 25 to maintain the main sputtering plasma. The magnet assembly or pack 30 includes a yoke 36 of soft steel or other high magnetic permeability material. The magnet rings 31–33 are preferably circular array of ring magnets each formed of a series or array of discrete square magnet components arranged in a frusto-conical shape in the respective ring with their poles and polar axes oriented in the same direction in a radial-axial plane of the cone around each respective ring. Small discrete magnets may be fixed to the yoke 36 which may then serve as a structural framework for the magnet assembly and define the shape of the cone 35.

The polar axes of the magnets of the inner ring 31 are oriented parallel to the target surface 26. The yoke 36 is shaped so that the entire pole face of the magnets of the inner ring 31, which in the illustration is the south pole S, are in magnetic contact, that is, in physical contact or in close proximity, with the yoke 36. The polar axes of the magnets of the outer ring 33, which in the illustration is a line through the north pole N and the south pole S of the magnets of ring 33, are oriented perpendicular to the target surface 26, with the entire pole face of the magnets of the outer ring 33 in magnetic contact with the yoke 36. The magnetic flux lines 51 between magnet rings 31, 33 form the main magnetic tunnel 41.

The central magnet ring 32 is situated approximately halfway between the innermost, or N, pole of the inner magnet ring 31 and the center of the outer magnet ring 33, defining the effective position 40a of the centerline 40 of the main magnetic tunnel 41. The magnets of the center ring 32 may, but need not be, in direct physical or substantial magnetic contact with the yoke 36. The polar axes of the magnets of the center ring 32 are oriented primarily parallel to the target surface 26. The faces of neither pole of the magnets of the center ring 32 is in contact with the yoke 36. The magnets polar axis of the center ring 32 is oriented in the opposite direction of the polar axis of the inner ring 31, shown in FIG. 2 with the S pole of the central ring 32 facing the S pole of the inner ring 31. As such, magnetic flux lines 52 between the inner row 31 and the center row 32 form an inner, minor magnetic tunnel 42 under the flux lines 51 forming the main magnetic tunnel 41. The inner, minor tunnel 42 affects the erosion of the target toward the end of the life of the target 25 over an inner annular area 46 of the target surface 26. Magnetic flux or field lines are illustrated in FIG. 2 in a radial plane that contains the axis 15.

The magnetic flux lines 53 between the center ring 32 and the outer ring 31 form an outer, minor magnetic tunnel 43 under the flux lines 51 that form the main tunnel 41. The outer, minor tunnel 43 affects the erosion of the target toward the end of the life of the target 25 over an outer annular area 47 of the target surface 26. Magnetic flux lines 54 between the poles of the center ring 32 oppose the flux lines 51 that form the main tunnel 41 to reduce the effects of the main tunnel 41 as the target 25 erodes. The continuous, progressive flattening of the flux lines 51 that produce the main tunnel into the target 25 along the centerline 40 is caused by the continuous progressive increase in the contribution of the flux lines 52, 53 that produce the minor tunnels 42, 43 into the target 25 at the areas 46, 47, respectively. A null point 55, where opposing field lines from the magnet rings 31–33 cancel, will exist in the resultant magnetic fields from the magnet assembly 30. This point is located near the centerline 40 close to the center magnet ring 32. This null point is behind the target surface 26 throughout target life.

The orientation of the inner ring 31 of magnets parallel to the surface 26 of the target 25 enhances the formation of the inner magnetic tunnel 52 and permits a more aggressive magnetic field shape for a given target width. In addition, orientation of the polar axis of the inner ring 31 parallel to the target surface 26 allows for more target erosion near the inner diameter of the target 25. This relieves the space limitations at the central opening 21 of the source 13. These advantages result because the magnets of the inner ring 31 are oriented parallel to the target surface so that the formation of the flux lines of the inner magnetic tunnel from the inner most poles of the inner ring magnets are already curling back to the opposite pole as they emerge from the magnets, allowing the inner tunnel to be created in a smaller amount of space than if the poles of these inner magnets were oriented perpendicular to the target surface, while promoting more erosion at the inner edge of the target, thereby minimizing particulate generation. The magnets of the outer ring are oriented perpendicular to the target surface to prevent flux-line skew, and overhand the outer edge of the target to achieve full-faced erosion, thereby occupying additional space at the target outer edge. The invention achieves advantageous erosion without requiring additional space at the target inner edge.

The main tunnel 41, which is produced by magnetic field lines between the inner magnet ring 31 and the outer magnet ring 33, affects the target erosion at the beginning of a target's life. For thicker targets, the plasma is confined to an erosion groove along the surface 26 of the target 25 on a circular centerline 40 on the target surface 26 at an intermediate radius of the annular target 25. Later in the target life of such thicker targets, as the surface 26 erodes and recedes into the center of the target 25 along the centerline 40, the field lines forming the tunnel 41 are gradually flattened along the centerline 40 due to the effect of the opposing magnetic field of the central magnet ring 32 and the effect of the inner and outer tunnels on the shape of the main magnetic tunnel. The relative influences of the erosion profiles of the magnetic tunnels are such that the plasma confined by the respective tunnels produces a greater target erosion rate at the centerline 40 than at the inner and outer areas 46, 47 when a thick target 25 is uneroded. This ratio continuously and progressively changes to a lesser target erosion rate at the centerline 40 than at the inner and outer areas 46, 47 as the target erodes. The inner and outer magnetic tunnels 52, 53, respectively, distribute the target erosion toward the inner and outer rims of the target annulus toward the end of the target life. The erosion groove thereby broadens as the target erodes, leading to more uniform target erosion and thereby enhanced target material utilization.

The magnet packs contain a number of holes (not shown) bored parallel to the axis 15 which carry feedthroughs for water and DC power to the target 25. The assembly of magnets 30 is coated with a hard polymer coating such as polyurethane or enclosed within non-magnetic, metallic or plastic cladding pieces, which are bonded to the magnet pack 30. The coating prevents the magnets of the rings 31–33 and the yoke 36 from becoming oxidized in air and also prevents the magnets of the rings 31–33, which may be of sintered construction, from becoming a contaminating particle source. Cooling water to the target 25 may pass through stub assemblies (not shown) through the yoke 36.

While the above description and accompanying drawings set forth various embodiments of the invention, it will be apparent to those skilled in the art that additions and modifications may be made without departing from the principles of the invention.

What is claimed is:

1. A sputtering apparatus comprising:

a vacuum processing chamber;

a substrate support in the processing chamber for supporting a substrate for processing;

a magnetron sputtering cathode assembly including:

a frusto-conical sputtering target having an interior conical sputtering surface facing the substrate support and having an inner edge, an outer edge that is closer to the substrate support than the inner edge and a centerline between the inner and outer edges thereof, and a frusto-conical magnet assembly situated behind, and parallel to, the sputtering target, the magnet assembly being configured to produce:

a first magnetic tunnel having first magnetic field lines extending along radial planes, spanning a major portion of the sputtering surface over the centerline of the sputtering surface, a second magnetic tunnel having second magnetic field lines extending along the radial planes and oriented to support the first magnetic field lines over an annular inner area of the sputtering surface predominantly between the inner edge and centerline thereof over the inner area of the sputtering surface, and a third magnetic tunnel having third magnetic field lines extending along the radial planes and oriented to support the first magnetic field lines over an annular outer area of the sputtering surface predominantly between the outer edge and centerline thereof over the outer area of the sputtering surface;

the resultant magnetic fields being such that plasma is confined predominantly by the first magnetic tunnel when the target is uneroded and progressively changing to fields that are such that plasma predominantly confined by the second and third magnetic tunnels after the target has eroded, so that the plasma produces a target erosion rate that is greater at the centerline than at the inner and outer areas when the target is uneroded and that continuously and progressively declines at the centerline relative to the rate at the inner and outer areas as the target erodes.

2. The apparatus of claim 1 wherein:

the frusto-conical magnet assembly includes an inner pole of a first polarity and an outer pole of a second polarity producing the first magnetic tunnel by a first magnetic field extending between the inner and outer poles.

3. The apparatus of claim 2 wherein:

the frusto-conical magnet assembly further includes an inner-central pole of the second polarity and an outer-central pole of the first polarity producing a reverse magnetic field opposing the first magnetic field on the centerline of the target such that the resulting flux produced by the first and reverse magnetic fields flattens on the centerline as the sputtering surface erodes into the target.

4. The apparatus of claim 3 wherein:

the inner pole and the inner-central pole producing the second magnetic tunnel formed of second magnetic field lines extending between the inner and inner-central poles beneath the first magnetic tunnel over an annular inner area of the sputtering surface predominantly between the inner edge and centerline thereof, and the outer pole and the outer-central pole producing the third magnetic tunnel formed of third magnetic field lines extending between the outer and outer-central poles beneath the first magnetic tunnel over an annular outer area of the sputtering surface predominantly between the outer edge and centerline thereof.

5. The apparatus of claim 4 wherein the magnet assembly further comprises:

a plurality of circular magnetic rings arranged in a cone behind, and parallel to, the conical sputtering target, each ring having a circumference, a diameter and a common central axis through the center of the cone and the center of the target, the magnetic rings each having a first and a second magnetic pole and a polar axis extending between the poles thereof and perpendicular to the circumference of the ring, the plurality of magnetic rings including an inner magnetic ring having the inner pole forming the first pole thereof, an outer magnetic ring having the outer pole forming the second pole thereof and an intermediate magnetic ring having the outer-central pole forming the first pole thereof and the inner-central pole forming the second pole thereof, the diameter of the inner magnetic ring being less than that of the intermediate magnetic ring which is less than the diameter of the outer magnetic ring;

the polar axes of the magnetic rings being further oriented:

parallel to the cone for the inner magnetic ring with the first pole thereof closer to the axis than the second pole thereof, parallel to the cone for the intermediate magnetic ring with the second pole thereof closer to the axis than the first pole thereof, and perpendicular to the cone for the outer magnetic ring with the second pole thereof closer to the axis than the first pole thereof; and a yoke of magnetically permeable material behind the cone and magnetically interconnecting the second pole of the inner magnetic ring with the first pole of the outer magnetic ring.

6. The apparatus of claim 4 wherein the magnet assembly further comprises:

a plurality of circular magnetic rings arranged in a cone behind, and parallel to, the conical sputtering target, each ring having a circumference, a diameter and a common central axis through the center of the cone and the center of the target, the magnetic rings each having a first and a second magnetic pole and a polar axis extending between the poles thereof and perpendicular to the circumference of the ring, the plurality of magnetic rings including an inner magnetic ring having the inner pole forming the first pole thereof, an outer magnetic ring having the outer pole forming the second pole thereof and an intermediate magnetic ring having the outer-central pole forming the first pole thereof and the inner-central pole forming the second pole thereof, the diameter of the inner magnetic ring being less than that of the intermediate magnetic ring which is less than the diameter of the outer magnetic ring.

7. The apparatus of claim 4 wherein the magnet assembly further comprises:

a plurality of circular magnetic rings arranged in a cone behind, and parallel to, the conical sputtering target, each ring having a circumference, a diameter and a common central axis through the center of the cone and the center of the target, the magnetic rings each having a first and a second magnetic pole and a polar axis extending between the poles thereof and perpendicular to the circumference of the ring;

the polar axes of the magnetic rings being further oriented:

parallel to the cone for the inner magnetic ring with the first pole thereof closer to the axis than the second pole thereof, parallel to the cone for the intermediate magnetic ring with the second pole thereof closer to the axis than the first pole thereof, and perpendicular to the cone for the outer magnetic ring with the second pole thereof closer to the axis than the first pole thereof.

8. The apparatus of claim 4 wherein the magnet assembly further comprises:

a plurality of circular magnetic rings arranged in a cone behind, and parallel to, the conical sputtering target, each ring having a circumference, a diameter and a common central axis through the center of the cone and the center of the target, the magnetic rings each having a first and a second magnetic pole and a polar axis extending between the poles thereof and perpendicular to the circumference of the ring; and a yoke of magnetically permeable material behind the cone and magnetically interconnecting the second pole of the inner magnetic ring with the first pole of the outer magnetic ring.

9. The apparatus of claim 1 wherein the magnet assembly further comprises:

a plurality of circular magnetic rings arranged in a cone behind, and parallel to, the conical sputtering target, each ring having a circumference, a diameter and a common central axis through the center of the cone and the center of the target, the magnetic rings each having a first and a second magnetic pole and a polar axis extending between the poles thereof and perpendicular to the circumference of the ring, the plurality of magnetic rings including an inner magnetic ring, an outer magnetic ring and an intermediate magnetic ring, the diameter of the inner magnetic ring being less than that of the intermediate magnetic ring which is less than the diameter of the outer magnetic ring;

the polar axes of the magnetic rings being further oriented:

parallel to the cone for the inner magnetic ring with the first pole thereof closer to the axis than the second pole thereof, parallel to the cone for the intermediate magnetic ring with the second pole thereof closer to the axis than the first pole thereof, and perpendicular to the cone for the outer magnetic ring with the second pole thereof closer to the axis than the first pole thereof; and a yoke of magnetically permeable material behind the cone and magnetically interconnecting the second pole of the inner magnetic ring with the first pole of the outer magnetic ring.

10. The apparatus of claim 1 wherein the magnet assembly further comprises:

a plurality of circular magnetic rings arranged in a cone behind, and parallel to, the conical sputtering target, each ring having a circumference, a diameter and a common central axis through the center of the cone and the center of the target, the magnetic rings each having a first and a second magnetic pole and a polar axis extending between the poles thereof and perpendicular to the circumference of the ring, the plurality of magnetic rings including an inner magnetic ring, an outer magnetic ring and an intermediate magnetic ring, the diameter of the inner magnetic ring being less than that of the intermediate magnetic ring which is less than the diameter of the outer magnetic ring.

11. The apparatus of claim 1 wherein the magnet assembly further comprises:

a plurality of circular magnetic rings arranged in a cone behind, and parallel to, the conical sputtering target, each ring having a circumference, a diameter and a common central axis through the center of the cone and the center of the target, the magnetic rings each having a first and a second magnetic pole and a polar axis extending between the poles thereof and perpendicular to the circumference of the ring;

the polar axes of the magnetic rings being further oriented:

parallel to the cone for the inner magnetic ring with the first pole thereof closer to the axis than the second pole thereof, parallel to the cone for the intermediate magnetic ring with the second pole thereof closer to the axis than the first pole thereof, and perpendicular to the cone for the outer magnetic ring with the second pole thereof closer to the axis than the first pole thereof.

12. The apparatus of claim 1 wherein the magnet assembly further comprises:
   a plurality of circular magnetic rings arranged in a cone behind, and parallel to, the conical sputtering target, each ring having a circumference, a diameter and a common central axis through the center of the cone and the center of the target, the magnetic rings each having a first and a second magnetic pole and a polar axis extending between the poles thereof and perpendicular to the circumference of the ring; and
   a yoke of magnetically permeable material behind the cone and magnetically interconnecting the second pole of the inner magnetic ring with the first pole of the outer magnetic ring.

13. A magnetron sputtering cathode assembly comprising:
   a frusto-conical sputtering target having an interior conical sputtering surface, a circular inner edge, a circular outer edge and a circular erosion centerline between the inner and outer edges thereof, and
   a frusto-conical magnet assembly situated behind, and parallel to, the sputtering target, the magnet assembly having:
      an inner pole of a first polarity and an outer pole of a second polarity producing a first magnetic tunnel formed of a first magnetic field extending between the inner and outer poles,
      an inner-central pole of the second polarity and an outer-central pole of the first polarity producing a reverse magnetic field opposing the first magnetic field on the centerline of the target such that the resulting flux of the first and reverse magnetic fields flattens on the centerline as the sputtering surface erodes into the target,
      the inner pole and the inner-central pole producing a second magnetic tunnel formed of second magnetic field lines extending between the inner and inner-central poles beneath the first magnetic tunnel and beneath the sputtering surface when the target is uneroded, and which emerge over an annular inner area of the sputtering surface predominantly between the inner edge and centerline thereof as the target erodes, and
      the outer pole and the outer-central pole producing a third magnetic tunnel formed of third magnetic field lines extending between the outer and outer-central poles beneath the first magnetic tunnel and beneath the sputtering surface when the target is uneroded, and which emerge over an annular outer area of the sputtering surface predominantly between the outer edge and centerline thereof as the target erodes;
      whereby the relative contributions of the magnetic tunnels are such that confined plasma produces a target erosion rate that is greater at the centerline than at the inner and outer areas when the target is uneroded and that continuously and progressively declines at the centerline in relation to the rate at the inner and outer areas as the target erodes.

14. The magnetron sputtering cathode assembly of claim 13 wherein the magnet assembly further comprises:
   a plurality of circular magnetic rings arranged in a cone behind, and parallel to, the conical sputtering target, each ring having a circumference, a diameter and a common central axis through the center of the cone and the center of the target, the magnetic rings each having a first and a second magnetic pole and a polar axis extending between the poles thereof and perpendicular to the circumference of the ring, the plurality of magnetic rings including an inner magnetic ring having the inner pole forming the first pole thereof, an outer magnetic ring having the outer pole forming the second pole thereof and an intermediate magnetic ring having the outer-central pole forming the first pole thereof and the inner-central pole forming the second pole thereof, the diameter of the inner magnetic ring being less than that of the intermediate magnetic ring which is less than the diameter of the outer magnetic ring;
   the polar axes of the magnetic rings being further oriented:
      parallel to the cone for the inner magnetic ring with the first pole thereof closer to the axis than the second pole thereof,
      parallel to the cone for the intermediate magnetic ring with the second pole thereof closer to the axis than the first pole thereof, and
      perpendicular to the cone for the outer magnetic ring with the second pole thereof closer to the axis than the first pole thereof; and
   a yoke of magnetically permeable material behind the cone and magnetically interconnecting the second pole of the inner magnetic ring with the first pole of the outer magnetic ring.

15. The magnetron sputtering cathode assembly of claim 13 wherein the magnet assembly further comprises:
   a plurality of circular magnetic rings arranged in a cone behind, and parallel to, the conical sputtering target, each ring having a circumference, a diameter and a common central axis through the center of the cone and the center of the target, the magnetic rings each having a first and a second magnetic pole and a polar axis extending between the poles thereof and perpendicular to the circumference of the ring, the plurality of magnetic rings including an inner magnetic ring having the inner pole forming the first pole thereof, an outer magnetic ring having the outer pole forming the second pole thereof and an intermediate magnetic ring having the outer-central pole forming the first pole thereof and the inner-central pole forming the second pole thereof, the diameter of the inner magnetic ring being less than that of the intermediate magnetic ring which is less than the diameter of the outer magnetic ring.

16. The magnetron sputtering cathode assembly of claim 13 wherein the magnet assembly further comprises:
   a plurality of circular magnetic rings arranged in a cone behind, and parallel to, the conical sputtering target, each ring having a circumference, a diameter and a common central axis through the center of the cone and the center of the target, the magnetic rings each having a first and a second magnetic pole and a polar axis extending between the poles thereof and perpendicular to the circumference of the ring;
   the polar axes of the magnetic rings being further oriented:
      parallel to the cone for the inner magnetic ring with the first pole thereof closer to the axis than the second pole thereof,
      parallel to the cone for the intermediate magnetic ring with the second pole thereof closer to the axis than the first pole thereof, and
      perpendicular to the cone for the outer magnetic ring with the second pole thereof closer to the axis than the first pole thereof.

17. The magnetron sputtering cathode assembly of claim 13 wherein the magnet assembly further comprises:

a plurality of circular magnetic rings arranged in a cone behind, and parallel to, the conical sputtering target, each ring having a circumference, a diameter and a common central axis through the center of the cone and the center of the target, the magnetic rings each having a first and a second magnetic pole and a polar axis extending between the poles thereof and perpendicular to the circumference of the ring; and a yoke of magnetically permeable material behind the cone and magnetically interconnecting the second pole of the inner magnetic ring with the first pole of the outer magnetic ring.

18. A magnet assembly for a magnetron sputtering cathode assembly having a conical sputtering target with an interior conical sputtering surface bounded by a circular inner edge and a circular outer edge and having a circular centerline on the sputtering surface between the inner and outer edges thereof, the magnet assembly comprising:

a plurality of circular magnetic rings arranged in a cone to be situated behind, and parallel to, the conical sputtering target, each ring having a common central axis, a circumference and a diameter, the magnetic rings having first and second magnetic poles and polar axes extending between the respective poles thereof and perpendicular to the respective circumferences thereof, the plurality of magnetic rings including an inner magnetic ring, an outer magnetic ring and an intermediate magnetic ring, the diameter of the inner magnetic ring being less than that of the intermediate magnetic ring which is less than the diameter of the outer magnetic ring;

the polar axes of the magnetic rings being further oriented:

parallel to the cone for the inner magnetic ring with the first pole thereof closer to the axis than the second pole thereof, parallel to the cone for the intermediate magnetic ring with the second pole thereof closer to the axis than the first pole thereof, and perpendicular to the cone for the outer magnetic ring with the second pole thereof closer to the axis than the first pole thereof; and a yoke of magnetically permeable material behind the cone and magnetically interconnecting the second pole of the inner magnetic ring with the first pole of the outer magnetic ring.

19. A sputtering method comprising:

supporting a substrate on a support in a vacuum in the processing chamber;

energizing a frusto-conical sputtering target to form a plasma and sputtering material with the plasma from an interior conical sputtering surface having a centerline surrounding an annular inner area of the sputtering surface surrounded by an annular outer area of the sputtering surface;

providing a frusto-conical magnet assembly behind the sputtering target and producing therewith:

a first magnetic tunnel having first magnetic field lines extending along radial planes and spanning a major portion of the sputtering surface, a second magnetic tunnel having second magnetic field lines extending along the radial planes and oriented to support the first magnetic field lines over the annular inner area of the sputtering surface, and a third magnetic tunnel having third magnetic field lines extending along the radial planes and oriented to support the first magnetic field lines over the annular outer area of the sputtering surface;

whereby an effectively flat magnetic flux is produced in a radial cross-section over the surface of the conical sputtering target.

20. The method of claim 19 wherein:

as the target erodes, the first magnetic flux at the eroding surface of the target over the centerline is flattened while the second and third magnetic tunnels emerge respectively over the inner and outer areas of the sputtering surface and plasma is confined by the magnetic tunnels, producing a target erosion rate that is initially greater at the centerline than at the inner and outer areas and continuously and progressively becomes less at the centerline than at the inner and outer areas.

* * * * *

UNITED STATES PATENT AND TRADEMARK OFFICE
CERTIFICATE OF CORRECTION

PATENT NO.    : 6,458,252 B1
DATED         : October 1, 2002
INVENTOR(S)   : Russell It is certified that error appears in the above-identified patent and that said Letters Patent is hereby corrected as shown below:

<u>Column 7,</u>
Line 58, "a second magnetic tunnel having second magnetic filed lines…" should start a new sub-paragraph.

Signed and Sealed this

Thirteenth Day of May, 2003

JAMES E. ROGAN
*Director of the United States Patent and Trademark Office*